United States Patent [19]

Timberlake

[11] Patent Number: 5,512,164
[45] Date of Patent: Apr. 30, 1996

[54] METHOD FOR SPUTTERING WITH LOW FREQUENCY ALTERNATING CURRENT

[75] Inventor: John R. Timberlake, Allentown, N.J.

[73] Assignee: The United States of America as represented by the United States Department of Energy, Washington, D.C.

[21] Appl. No.: 309,715

[22] Filed: Sep. 21, 1994

Related U.S. Application Data

[63] Continuation-in-part of Ser. No. 70,835, Jun. 3, 1993, abandoned.

[51] Int. Cl.$^6$ ............................. C23C 28/02; C23C 14/34
[52] U.S. Cl. ............... 205/186; 204/192.12; 204/192.15; 204/192.16; 204/298.08
[58] Field of Search .................. 204/192.12, 192.15, 204/192.16, 298.08; 205/186

[56] References Cited

U.S. PATENT DOCUMENTS

| | | | |
|---|---|---|---|
| 4,724,296 | 2/1988 | Morley | 219/121.54 |
| 5,013,604 | 5/1991 | Allen et al. | 428/402 |
| 5,082,546 | 1/1992 | Szczyrbowski et al. | 204/298.08 |

FOREIGN PATENT DOCUMENTS

| | | | |
|---|---|---|---|
| 95311 | 8/1970 | France | 204/298.08 |
| 3802852A1 | 8/1989 | Germany | 204/298.08 |

OTHER PUBLICATIONS

"New Techniques for Sputtering Pure Boron and Boron--Carbon Compositions", Timberlake, et al., Abstract for 33rd Meeting, Division of Plasma Physics Nov. 4, 1991.

*Primary Examiner*—Aaron Weisstuch
*Attorney, Agent, or Firm*—Mark P. Dvorscak; Robert J. Fisher; William R. Moser

[57] ABSTRACT

Low frequency alternating current sputtering is provided by connecting a low frequency alternating current source to a high voltage transformer having outer taps and a center tap for stepping up the voltage of the alternating current. The center tap of the transformer is connected to a vacuum vessel containing argon or helium gas. Target electrodes, in close proximity to each other, and containing material with which the substrates will be coated, are connected to the outer taps of the transformer. With an applied potential, the gas will ionize and sputtering from the target electrodes onto the substrate will then result. The target electrodes can be copper or boron, and the substrate can be stainless steel, aluminum, or titanium. Copper coatings produced are used in place of nickel and/or copper striking.

7 Claims, 4 Drawing Sheets

METHOD FOR SPUTTERING WITH LOW FREQUENCY ALTERNATING CURRENT

The United States Government has rights in this invention pursuant to Contract No. DE-AC02-76CH03073 between the U.S. Department of Energy and Princeton University.

This is a Continuation-In-Part of application Ser. No. 08/070,835 filed Jun. 3, 1993, now abandoned.

BACKGROUND OF THE INVENTION

The present invention relates generally to coating technology, and more particularly to a process for sputtering boron, copper, or titanium nitride with low frequency alternating current. The process has a wide range of applications. It has a specific application for coating tokamak walls in fusion reactors with boron. In addition, the invention has general application for coating any mechanical device subject to wear or corrosion with various materials.

Boron coating, or "boronization" of tokamaks, with either chemical vapor deposition of boron from boron containing compounds, or boronization from evaporation of solid targets of boron/carbon mixtures, has produced beneficial results. Boron has properties that are advantageous to improved reactor performance. As a material that comes in contact with the plasma edge, it has been found to reduce the influx of some materials, the recycling of hydrogenic species, the oxygen and oxygenated species, and even lower the loop voltage. The presence of boron also helps maintain the low atomic number needed for a tokamak coating. Additionally, the use of boron coatings may have widespread applicability in vacuum systems for electrical and/or corrosion resistance in contained environments with controlled atmospheres under non-vacuum conditions.

On a much broader scale than the boron coating of tokamaks, billions of dollars are spent annually to replace mechanical devices that are subjected to wear caused by abrasion, erosion, or corrosion during the course of normal service. Many of these components fail prematurely due to excessive wear in inert and corrosive service environments, and could be made to last longer by the use of harder and corrosive resistant materials. However, the cost of doing so is often prohibitively high.

Titanium nitride (TiN) is one compound that is used to deposit a hard durable coating on various materials to provide wear resistance or corrosion resistance or other similar properties. Generally these coatings have been produced on metal articles by chemical vapor deposition (CVD) or similar processes. CVD is used to deposit TiN to produce wear-resistant, nonabrasive surfaces on plain carbon steel articles. It is also used on external ornamental metal parts such as wrist watch cases, bands or bezels, to obtain a gold-colored surface having corrosion and wear resistance properties. TiN can also be used to place a hard durable coating on soft metals such as aluminum.

Coating with materials like TiN is generally done commercially by using ion plating techniques. Chemical vapor deposition of coatings requires high capital investment, high processing costs and is limited to very thin coatings and small parts. Of the thermal spray deposition methods which can be used to coat parts of unlimited size with coatings of unlimited thickness, flame spraying often yields a porous coating with oxide inclusions. There are a number of additional methods available for surface hardening or depositing corrosion and wear resistant materials on industrial parts. Among these methods are D.C. sources, electron beams, R.F. plasmas, diffusion treatments, nitrating and carburizing of ferrous based materials, electroplating, and sputtering.

A coating technique has been developed that resembles ion plating deposition but uses simple components. The technique reduces the cost by about two orders of magnitude less than currently used methods. This technique, using low frequency alternating current is also employed to produce adherent and thick coatings on metal without the need for nickel or copper striking.

Accordingly, it is an object of the present invention to provide an a.c. coating technique that uses simple components and reduces the cost compared to currently used coating methods.

It is another object of the present invention to produce adherent and thick coatings (by electroplating) of copper on stainless steel without the need for nickel and copper striking.

A further object of the present invention is to utilize the properties of an ionized gas to self-rectify low frequency (60 Hz) alternating current for sputtering.

SUMMARY OF THE INVENTION

An apparatus for sputtering with low frequency alternating current may include two target electrodes containing material with which to coat a substrate electrode placed inside a vacuum chamber containing a gas that becomes ionized with applied voltage. The substrate electrode could be the vacuum chamber itself. An a.c. circuit having at least one transformer being connected to the target electrodes and having a center tap connected to the vacuum chamber causes the ionized gas to behave as a full wave rectifier to bring about sputtering from the target electrodes onto the substrate electrode. The target electrodes can be copper and the substrate electrode can include stainless steel, aluminum, or titanium. Additionally, the target electrodes could be boron. The gas is usually argon and/or helium. For ideal performance, the target electrodes should be spaced suitably close together such that a sufficient amount of current is drawn between the center tap of the transformer and the vessel to cause sputtering to occur.

A method for low frequency alternating current sputtering may provide connecting the low frequency alternating current to a high voltage transformer having outer taps and a center tap; connecting target electrodes containing material with which the substrates will be coated to the outer taps of the transformer; connecting the center tap of the transformer to the substrate in the vacuum vessel or the vessel itself containing the gas that becomes ionized with the application of voltage, to provide a means for commencing electrical conduction in the target electrodes; and, sputtering from the target electrodes onto the substrate(s). The sputtering step may include coating the substrate with boron by providing electrodes containing boron. Additionally, a step may be provided for spacing the electrodes sufficiently close together such that a considerable amount of current is drawn between the center tap of the transformer and the vessel to cause sputtering to occur.

BRIEF DESCRIPTION OF THE DRAWINGS.

The above-mentioned and other features of the invention will become more apparent and be best understood, together with the description, by reference to the accompanying drawings, in which.

DETAILED DESCRIPTION OF THE INVENTION

Figure 1:
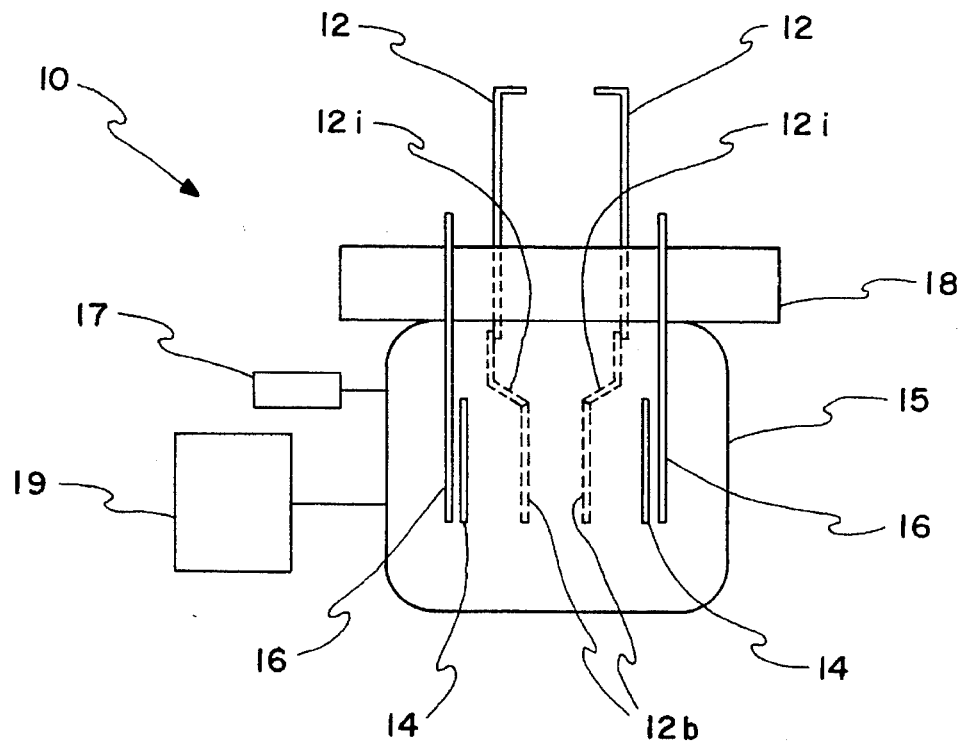
FIG. 1 shows a block diagram of an apparatus used for low frequency alternating current sputtering of copper.

Referring to FIG. 1, a block representation of an apparatus 10 that can be used for sputtering with a low frequency (60 Hz) alternating current is shown. Two target electrodes 12 contain material with which to coat at least one substrate 14. The target electrodes 12 and the substrate 14 are placed inside a vacuum chamber 15 that contains a gas that becomes ionized with applied voltage. A plexiglas mounting plate 18 is vacuum sealed to the chamber 15. The apparatus shown in FIG. 1 will sputter copper. The electrodes 12 are copper tubing having an insulated portion 12$i$, and a bare portion 12$b$ which is located inside the chamber 15. Inside the chamber 15 is a stainless steel tube 16 that serves as the substrate holder. Aluminum and titanium liners can be used inside the stainless steel tube 16. A vacuum pump 17 and a gas feed 19 are connected to the chamber 15.

Figure 2:
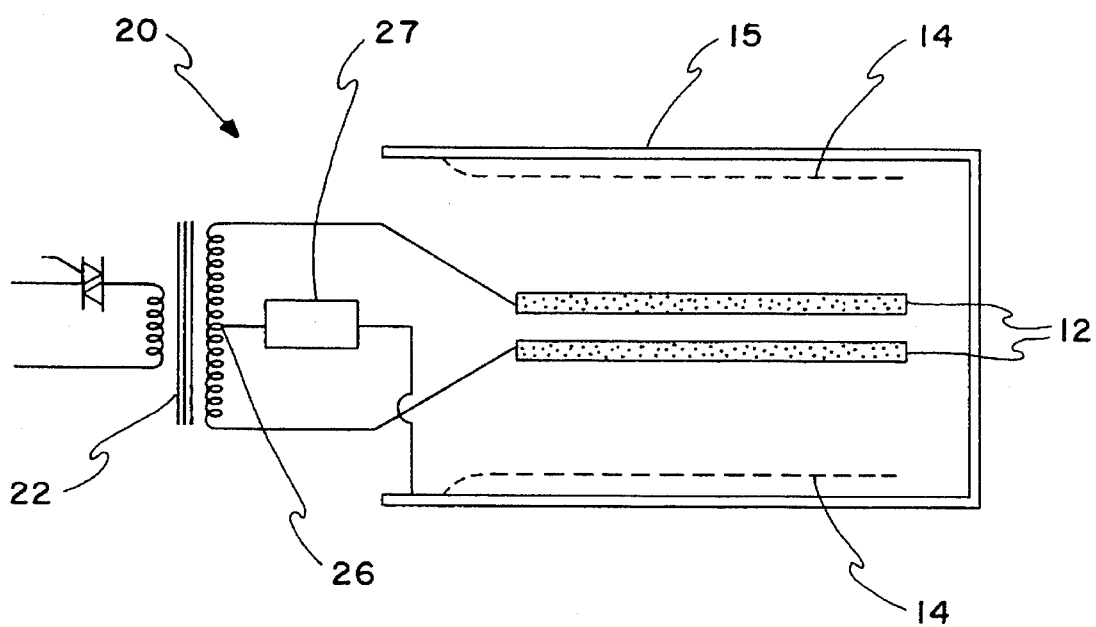
FIG. 2 shows a general circuit used for low frequency alternating current sputtering.

Referring now to FIG. 2, a general electrical circuit 20 of the apparatus depicted in FIG. 1 is schematically shown. At least one transformer 22 is connected to the target electrodes 12. The transformer 22 includes a center tap 26 which is directly connected to the substrate or substrate electrode 14, or a stainless steel vacuum chamber 15. A resistor, capacitor, passive network, or power supply 27 can also be inserted in this direct connection to the substrate 14 or chamber 15. The transformer 22 is supplied with a low frequency alternating current. The electrical connections shown in FIG. 2 will cause the gas to become ionized and behave as a full wave rectifier, to thereby cause sputtering to occur from the target electrodes 12 to the substrate electrode.

The target electrodes 12 can be copper, and the substrate 14 or chamber 15 can be stainless steel, aluminum, or titanium. Boron also can be used for the target electrodes 12. The gas may be argon and/or helium at 50 to 500 mTorr. At 80 to 100 mTorr, coatings of about 1000 Å in 4 hours were accomplished.

Figure 3A:
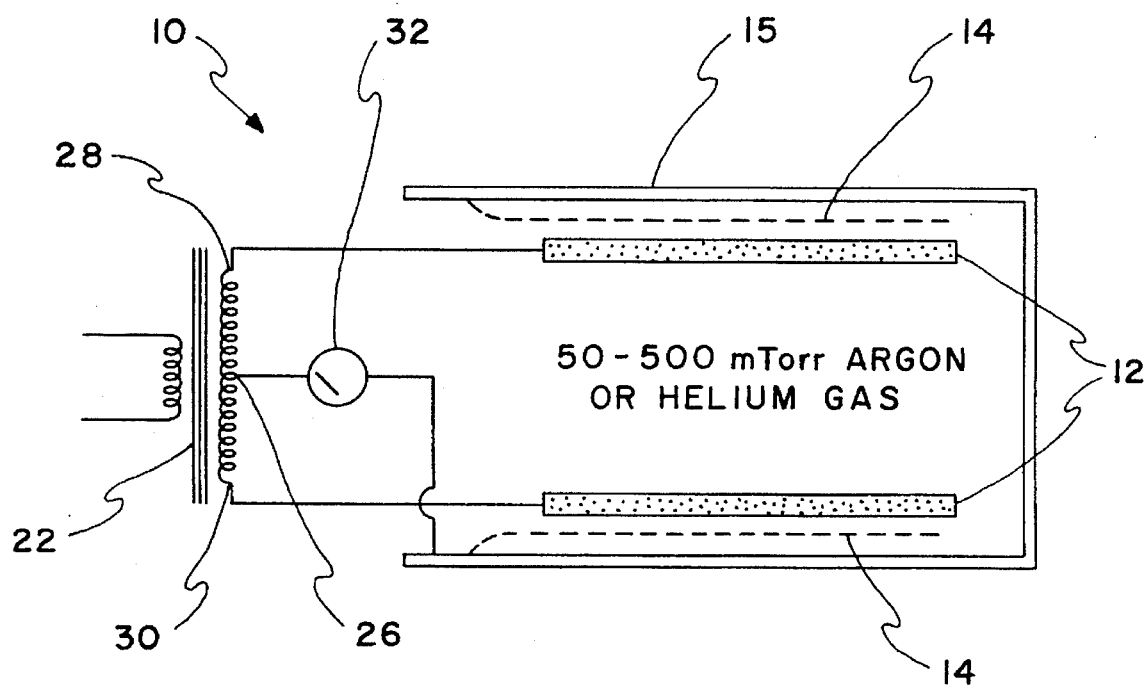
FIGS. 3a and 3b demonstrate the importance of the relative spacing of the electrodes used in the circuit of FIG. 2, while FIG. 3c graphs this, showing the characteristic breakdown voltage as a function of pressure-distance product; and, FIG. 4 shows a schematic of a circuit used for low frequency alternating current sputtering of boron.
Figure 3B:
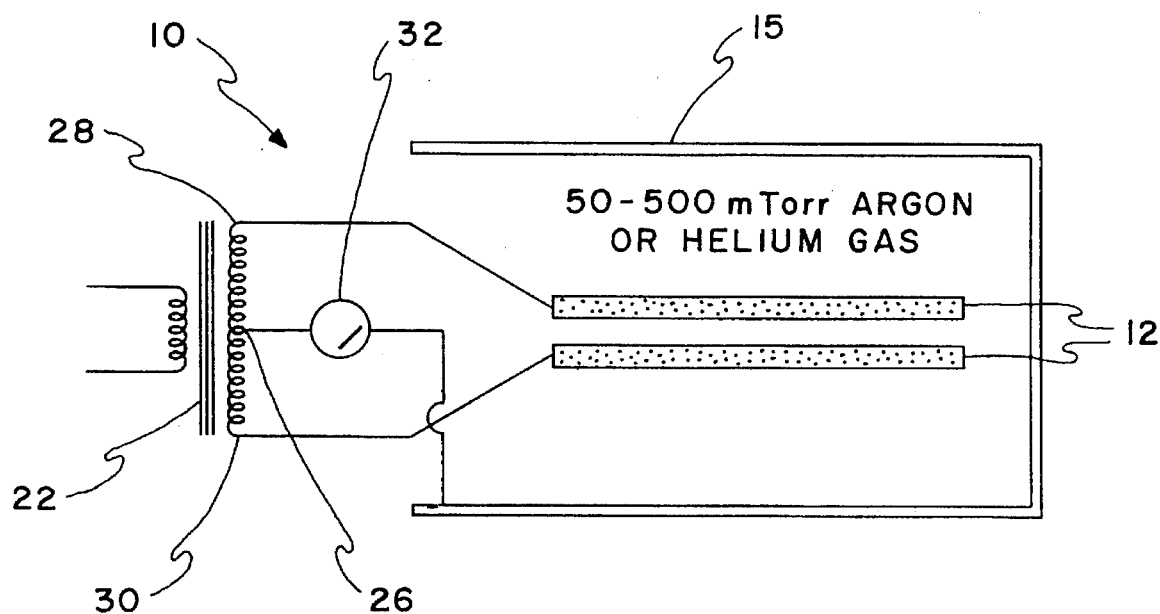

Referring to FIGS. 3a and 3b, a diagram depicting operation of the described apparatus 10 is shown. A method for low frequency alternating current sputtering includes connecting the low frequency alternating current to a high voltage transformer 22 having outer taps 28 and 30. The transformer also includes a center tap 26. The center tap 26 is directly connected to the substrate to be coated 14, or as shown in FIGS. 3a and 3b, to a stainless steel vacuum vessel 15, which serves as the substrate holder. The target electrodes 12, which contain the material with which the substrate(s) 14 will be coated, are connected to the outer taps of the transformer 22 at 28 and 30. This connection provides a means for commencing electrical conduction in the target electrodes, by which sputtering from the target electrodes 12 to the vacuum chamber 15 (or substrate 14) occurs.

It has been found that the method works when the electrodes 12 are relatively very close together. As seen in FIG. 3a, the electrodes are far apart. With the electrodes in this position, little current is drawn between the center tap 26 and the vessel 15. In "Vacuum Deposition of Thin Films", Holland, L. John Wiley & Sons, Inc., 1958 this condition is discussed when using a center tapped transformer, although the efficacy of its use is dismissed. However, when the electrodes 12 are very close together as seen in FIG. 3b (so that there is no glow between them), considerable current is drawn between the center tap 26 and the vessel 15. If the ammeter 32 was replaced with a capacitor, a D.C. voltage would be observed across the capacitor, which is also noted by Holland for a configuration such as shown in FIG. 3a.

Figure 3C:
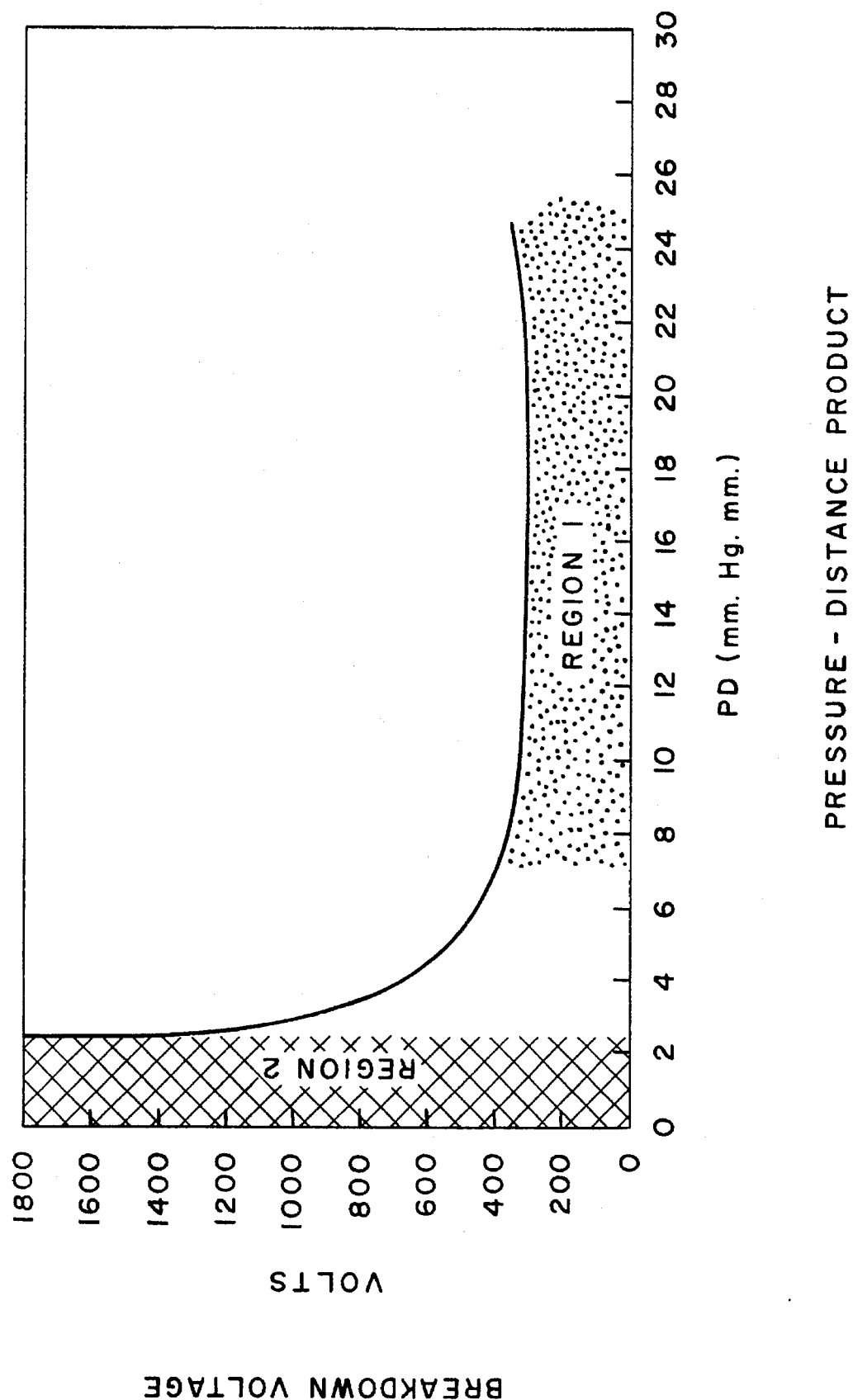

The voltage at which a gas starts a discharge depends on the product of the gas pressure times the distance between the electrodes (Paschen curve). FIG. 3c, taken from "Encyclopedia of Physical Science and Technology", Meyers, R. A. Editor, Academic Press, Inc., 1987:10;723, depicts a characteristic breakdown. In the configuration shown in FIG. 3a where the electrodes are far apart, the pressure-distance product is high and falls within region 1 of FIG. 3c, which means a discharge can form and be sustained between the two electrodes. The center tap serves only as a means for rectifying the a.c. In the configuration of 3b, where the electrodes are very close together, the pressure-distance product is small and falls in region 2 of FIG. 3c (the dark space of a glow), which means it is very difficult to form and sustain a discharge. But, since there is separation between the electrodes and the substrate 14, the half voltage of the center tap initiates and sustains the discharge such that sputtering occurs between the two electrodes. Thus, sputtering takes place when electrical breakdown and sustained glow does not occur between the target electrodes 12. However, the pressure times distance (pd) products with respect to one of the target electrodes and the more distant substrate 14 is in a region such as to force breakdown to occur, even though this is at a lower potential than the alternate target electrode, i.e. Region 1 in FIG. 1c. After breakdown occurs between one of the target electrodes 12 and the substrate 14, no sustained glow is visible between the target electrodes 12 even though the potential difference between these electrodes is greater than the potential difference between a target electrode and the substrate. That is, the target electrodes are spaced substantially close together, while the distance between either of the target electrodes and the substrate is greater than the distance between the electrodes. The preferred distance between the electrodes for sputtering to take place is about 5 to 8 millimeters.

To illustrate this concept, and referring to FIG. 3c, consider two cases, in which the pressure is 150 mTorr. For case 1, the separation between electrodes is about 2 inches (50.8 mm); in case 2, the electrode separation is less than ¼ inch (6.35 mm), resulting in pd values of 7.5 for case 1 and 0.6 for case 2. For case 1, breakdown and a lower sustaining voltage occurs for the two electrodes. However, for case 2, breakdown voltage is not achieved for the two electrodes, even at maximum voltage of about 600. However, if the electrodes are far enough away from the substrate, or wall of the vessel, then breakdown between the wall and an electrode can occur at half the maximum applied voltage. Thus, once breakdown is achieved between the wall and one of the electrodes (but not between the electrodes themselves), sputtering between the two electrodes can occur. Sputtering occurs alternately between one electrode and the substrate as well as between the two electrodes, and full wave rectification is obtained from the ionized gas. As noted by Holland, this is the preferred location for sputtering to occur, but the glow could not be started and sustained by itself. Thus, the embodiment of FIG. 3b provides for preferred sputtering between the electrodes, sputtering between the substrate and/vessel, and self rectification.

Although Holland rejects the use of a center tapped transformer, he does note that a glow across a longer distance may be used to sustain a glow within the dark space. However, he gives a much simpler two electrode example of the application. The three electrode configuration of FIG. 3b offers more possibilities for control of the quality and/or quantity of sputtering with a simple apparatus.

The coatings that can be sputtered are those as described above with respect to the apparatus. The substrate 14 (or stainless steel vacuum chamber 15) would be coated with boron if the electrodes 12 were boron or boron-containing rods, provided these boron-containing electrodes are heated to render them electrically conductive, since boron is not electrically conductive at room temperature. Similarly, the target electrodes 12 could be copper and the substrate 14 could be stainless steel, aluminum, or titanium.

As an example, copper was sputtered directly on stainless steel and this copper coating was plated with additional copper in a copper sulfate plating solution. The same was also done with titanium and aluminum. Where the stainless, the titanium, or the aluminum had not been sputtered with copper beforehand, the copper plating was non-adherent. The disclosed invention can thus serve as a means of flashing a substrate before electroplating. With stainless steel, electroplating with copper cannot usually be done without a flash undercoating of nickel. This low frequency A.C. sputtering technique has produced adherent and thick coatings Coy electroplating) of copper on stainless steel without the need for nickel and copper striking.

Figure 4:
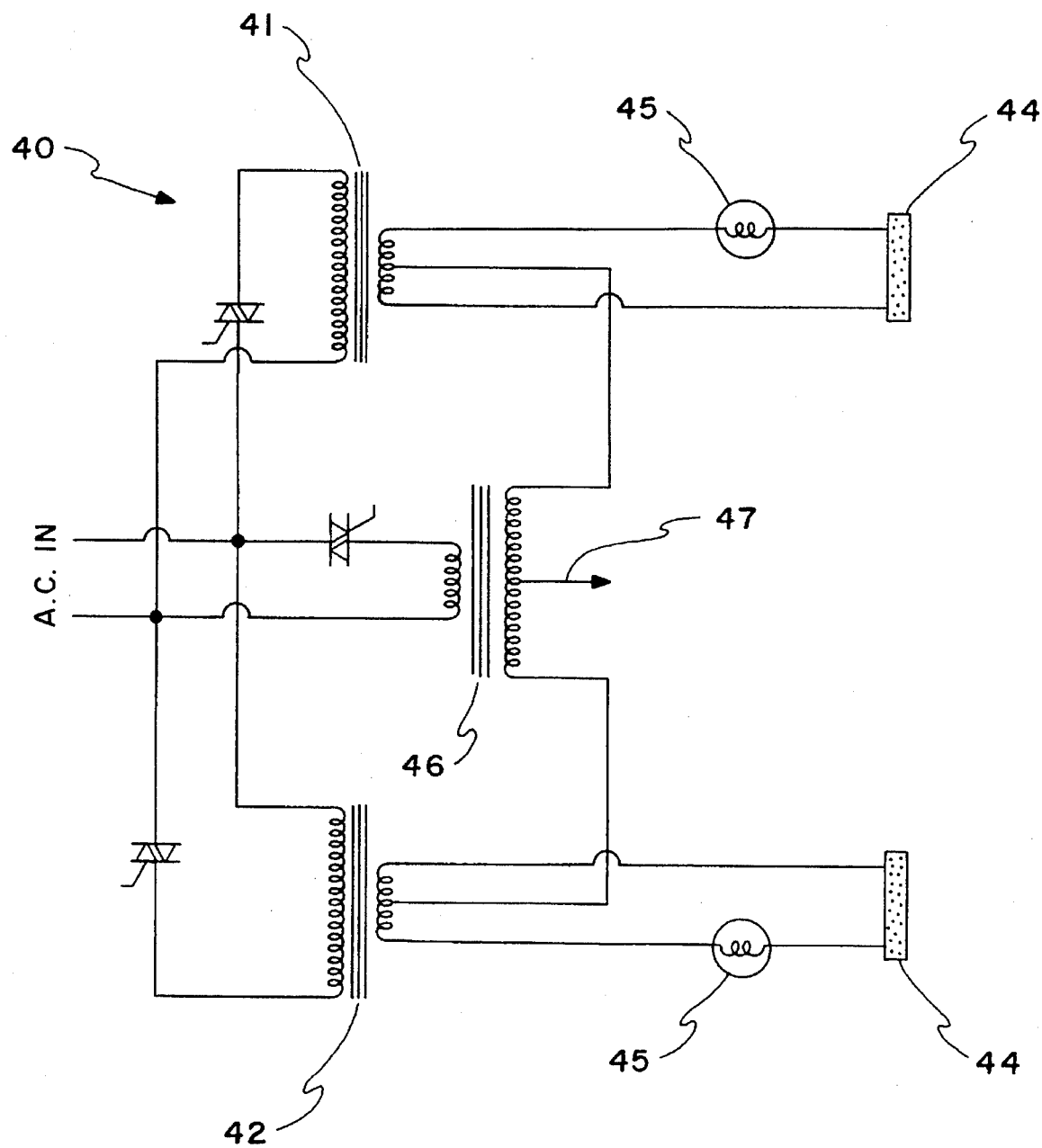

Referring to FIG. 4, a detailed schematic 40 used for low frequency alternating current sputtering of pure boron is shown. The circuit includes low voltage, high current, isolation transformers 41 and 42. The transformers 41 and 42 are connected to pure boron rods 44. A tungsten filament lamp 45, or other such negative temperature coefficient resistance means, is provided for each transformer 41 and 42 and boron rod 44. A high voltage, medium current transformer 46 is also provided. The center tap 47 of the transformer 46 is directly connected to the substrate to be coated. In FIG. 4, the substrate is a vacuum vessel and the center tap 47 has a direct connection to that vessel (not shown). The boron rods 44 are placed in the vacuum vessel. The system is started by lowering the electrical resistance of the boron rods to allow electrical conduction in the rod while countering a current avalanche that commences when the heating rate by conduction exceeds the cooling rate, until a steady equilibrium is reached. The current avalanche is countered with the tungsten filament lamps 45. The vessel is evacuated to about 50–500 mTorr helium and/or argon, and itself can be the substrate of the sputtering. Once equilibrium is reached, the substrate or vacuum vessel is coated with boron by sputtering from the boron rods by applying an electrical potential between the target material and the vacuum vessel via transformer 46.

There has thus been shown a method and an apparatus for sputtering with low frequency alternating current. The method utilizes the properties of an ionized gas to self rectify low frequency (60 Hz) alternating current for sputtering. It is a three electrode method where two electrodes are the target material and the third electrode is the substrate. The method works when the target electrodes are spaced relatively close together so that there is no glow between the electrodes.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described to best explain the principles of the invention and its practical application and thereby enable others skilled in the art to best explain the principles of the invention and its practical application and thereby enable others skilled in the art to best utilize the invention in various embodiments and with various modifications as are suited to the particular use contemplated. It is intended that the scope of the invention be defined by the claims appended hereto.

I claim:

1. A method for low frequency alternating current sputtering comprising:

a. connecting a source of low frequency alternating current to a high voltage step-up transformer having outer taps and a center tap;

b. connecting the center tap of the transformer to an electrically conductive vacuum vessel containing substrates to be coated, and further, said vessel containing a gas capable of becoming ionized with an applied high voltage;

c. connecting target electrodes containing material with which the substrates will be coated to the outer taps of the transformer, the distance between either of the target electrodes and the substrate being greater than the distance between the target electrodes themselves, such that the potential difference between the target electrodes is greater than the potential difference between either of the target electrodes and the substrate;

d. initiating and sustaining a discharge such that breakdown occurs between a target electrode and the substrate, while no breakdown occurs between the target electrodes, such that sputtering occurs from the target electrodes onto the substrates.

2. The method of claim 1 including coating the substrate with boron by providing electrodes containing heated, electrically conductive boron.

3. The method of claim 1 wherein a substrate coated with sputtered copper is electroplated in a copper plating solution to produce a thicker copper coating.

4. The method of claim 1 wherein the target electrodes are copper and the substrate is stainless steel, aluminum, or titanium.

5. The method of claim 1 wherein the target electrodes are boron and are heated to render said target electrodes electrically conductive.

6. The method of claim 1 wherein the ionized gas is argon or helium.

7. A method for low frequency alternating current sputtering comprising:

a. connecting a source of low frequency alternating current to a high voltage step-up transformer having outer taps and a center tap;

b. connecting the center tap of the transformer to an electrically conductive vacuum vessel containing substrates to be coated, and further, said vessel containing a gas under pressure and capable of becoming ionized with an applied high voltage;

c. connecting target electrodes containing material with which the substrates will be coated to the outer taps of the transformer, the target electrodes having a first distance between them, and one of the target electrodes and the substrate having a second distance between them, such that the pressure times the first distance product forces electrical breakdown to occur between one of the target electrodes and the substrate, while the pressure times the second distance product prevents electrical breakdown from occurring between the target electrodes so that sputtering occurs from the target electrodes onto the substrates.

* * * * *